United States Patent [19]

Reisman et al.

[11] Patent Number: 4,667,404

[45] Date of Patent: May 26, 1987

[54] METHOD OF INTERCONNECTING WIRING PLANES

[75] Inventors: Arnold Reisman, Raleigh; Carlton M. Osburn, Cary, both of N.C.

[73] Assignee: Microelectronics Center of North Carolina, Research Triangle Park, N.C.

[21] Appl. No.: 781,982

[22] Filed: Sep. 30, 1985

[51] Int. Cl.⁴ .............................................. H05K 3/02
[52] U.S. Cl. ....................................... 29/847; 174/68.5
[58] Field of Search ................. 174/68.5; 29/846, 847; 361/409, 414, 416

[56] References Cited

U.S. PATENT DOCUMENTS

| | | | |
|---|---|---|---|
| 3,142,112 | 7/1964 | Burkig et al. | 29/847 |
| 3,525,617 | 8/1970 | Bingham | 96/36.2 |
| 3,564,115 | 2/1971 | Gribble et al. | 361/409 X |
| 3,777,221 | 12/1973 | Tatusko et al. | 317/101 |
| 3,846,166 | 11/1974 | Saiki et al. | 174/68.5 X |
| 3,917,983 | 11/1975 | Kuronen | 317/101 |
| 3,959,579 | 5/1976 | Johnson | 174/68.5 |
| 4,371,744 | 2/1983 | Badet et al. | 174/68.5 |
| 4,426,548 | 1/1984 | Oritsuki et al. | 174/72 R |
| 4,458,297 | 7/1984 | Stopper et al. | 361/403 |
| 4,467,400 | 8/1984 | Stopper | 361/403 |
| 4,484,215 | 11/1984 | Pappas | 357/80 |
| 4,487,993 | 12/1984 | Becker | 174/68.5 |

FOREIGN PATENT DOCUMENTS 1425373  2/1976  United Kingdom ............... 174/68.5

Primary Examiner—Howard N. Goldberg
Assistant Examiner—Carl J. Arbes
Attorney, Agent, or Firm—Bell, Seltzer, Park & Gibson

[57] ABSTRACT

A microelectronics apparatus and a method of fabricating customized connections between wiring planes superposed on a substrate is disclosed. A first wiring plane having multiple conductors is formed upon the substrate. An insulating layer is formed that overlies and electrically insulates the first wiring plane. A second wiring plane having multiple conductors is formed above the insulating layer by forming multiple conductors that are electrically connected to the first wiring plane with selected conductors of the first wiring plane being electrically connected to selected conductors of the second wiring plane. The connections may be modified by breaking selected ones of the electrical connections between the first and second wiring planes to customize the electrical interconnections.

14 Claims, 4 Drawing Figures

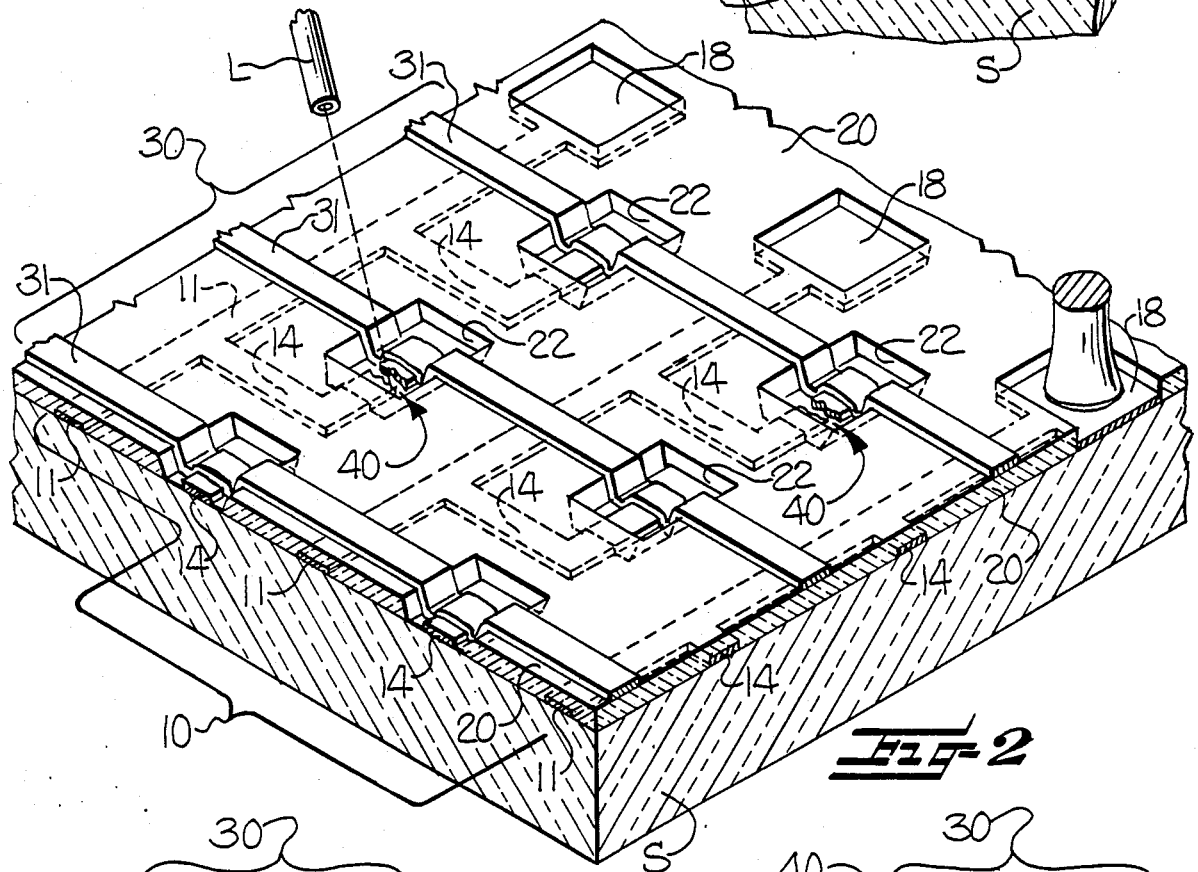
*Fig-1*
*Fig-2*
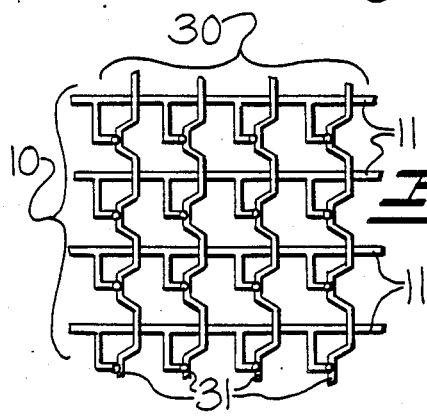
*Fig-3*
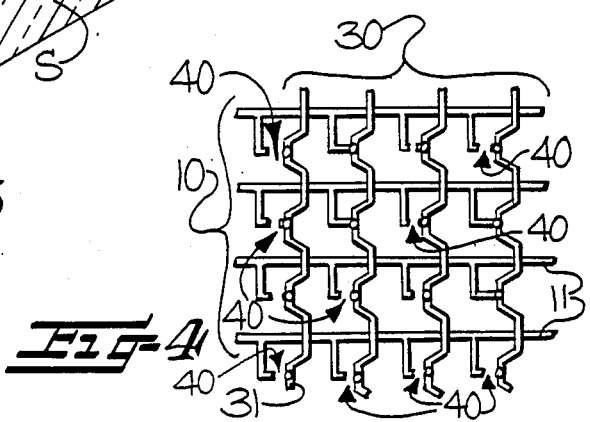
*Fig-4*

METHOD OF INTERCONNECTING WIRING PLANES

FIELD OF THE INVENTION

This invention relates generally to the field of fabricating electrical connections for microelectronics apparatus, such as the connections between semiconductor chips or the connections between devices on a semiconductor integrated circuit chip. More specifically, it relates to personalization or customization of the electrical connections without the need for a customized metallization layer mask.

BACKGROUND AND SUMMARY OF THE INVENTION

This invention relates to the field of semiconductor processing technology, and specifically to the field of custom or semi-custom fabrication of semiconductor chip packages or integrated circuit chips. In the present context, the term custom or semi-custom refers to microelectronics apparatus having devices, interconnections, etc. preformed in a regular or predetermined pattern, and interconnected, or not, as required for a custom use. Examples of such semi-custom apparatus includes master slice and master image wafers, and gate arrays. This invention may be used in the fabrication of integrated circuit chips to make electrical connections between the circuits on the chip, or in the fabrication of semiconductor chip packages to make electrical connections between integrated circuit chips thereon.

It is current practice for manufacturers to fabricate circuits on an integrated circuit chip wafer to the point where the only remaining processing steps are the formation of metallization layers to electrically connect the circuits. This partially completed wafer is then placed in inventory until it is sold to the ultimate customer as a semi-custom integrated circuit. The integrated circuit is then customized with the specification of particular metallization masks and the formation of the specific metallization layers which electrically connect the circuits to respond in the manner desired by the customer. A computer aided design program may be used to personalize the integrated circuits and to aid in defining or forming the final metallization mask, as is well known in the industry.

The time, effort and expense required to produce these metallization layer masks is significant, because each of the several metallization layer masks must be custom designed for each different type of integrated circuit or semiconductor chip package. This inherently leads to problems in design, prototype fabrication, manufacture, and testing, and each of these problems must be solved for each semi-custom circuit or package. In addition, the integrated circuit wafer or semiconductor chip package is at a higher risk of being damaged during the last processing steps needed to personalize the connections because each of the multiple step metallization processes is unique for each different semi-custom circuit. Another problem and added expense is the difficulty in producing satisfactory test devices that adequately test each circuit without first fabricating an entire mask. Thus, if any slight modifications in design are indicated after prototypes are produced, an entirely new mask must be produced, the fabrication processes must be repeated, and the test apparatus or program must be redesigned.

In accordance with the foregoing, it is an object of the present invention to provide a microelectronics apparatus, such as an integrated circuit chip or a semiconductor chip package, and a method for interconnecting wiring planes thereon.

It is another object of the present invention to provide a microelectronics apparatus and method of making it that eliminates the necessity of fabricating a unique set of metallization masks for each different semi-custom apparatus.

It is a still further object of the present invention to permit the manufacturer of the microelectronics apparatus to include multiple, connected wiring planes that may subsequently be personalized with a minimum of processing steps.

It is a still further object of the present invention to be able to produce prototype and final semicustom microelectronics apparatus without having to produce an entirely new mask if design changes are indicated.

SUMMARY OF THE INVENTION

The aforementioned problems are solved and the foregoing objects are met with the present invention by providing, for microelectronics apparatus, a method of fabricating customized connections between wiring planes on a substrate. It eliminates the necessity of creating multiple metallization layer masks for each specific integrated circuit chip or semiconductor chip package. The present invention provides a pair of wiring planes superposed on a substrate. A first wiring plane having multiple conductors is formed on the substrate. An insulating layer is formed that overlies the first wiring plane and electrically insulates the first wiring plane. A second wiring plane overlies the insulating layer and also has multiple conductors. Selected conductors of each wiring plane are electrically connected to selected conductors of the other wiring plane. Selected ones of the electrical connections between the first and second wiring planes are disconnected to customize the connections.

BRIEF DESCRIPTION OF THE DRAWINGS

For a more complete understanding of this invention, reference should now be had to the embodiment illustrated in greater detail in the accompanying drawings and described below by way of an example of the invention. In the drawings:

FIG. 1 is a schematic illustration of some of the masks required to fabricate customized electrical connections, showing particularly exemplary metallization and contact opening masks that may be used to fabricate a wiring plane, at least in part;

FIG. 2 is an elevated perspective view, in partial cross section, of a portion of a semiconductor chip package fabricated in accordance with the invention, and showing the interconnections between the wiring planes, which are separated by an insulating layer;

FIG. 3 is a schematic diagram of the initial electrical connections between the first and second wiring planes; and FIG. 4 is a schematic diagram of the electrical connections between the first and second wiring planes for an exemplary customized semiconductor chip package or integrated circuit chip.

DETAILED DESCRIPTION OF THE INVENTION

While the present invention will be described more fully hereinafter with reference to the accompanying drawings, in which a particular embodiment is shown, it is to be understood at the outset that persons skilled in the art may modify the invention herein described while still achieving the favorable results of this invention. Accordingly, the description which follows is to be understood as a broad teaching disclosure directed to persons skilled in the appropriate arts, and not as limiting upon the present invention.

Basic integrated circuit processing technology is well known and interested readers are referred to any one of several text books, such as that authored by Douglas J. Hamilton and William G. Howard entitled *Basic Integrated Circuit Engineering* published by McGraw Hill, Inc., 1975. FIG. 1 illustrates some of the series of masks required to fabricate typical metallization layers and electrical connections on a substrate S, including the dedicated metallization masks M1, M2, and the contact opening mask, which are used to fabricate the metal conductors. These sets of masks are different for every different custom chip or package.

The present invention is an improvement over the prior art since it provides a method of fabricating customized connections which eliminates the need for sets of dedicated metallization layer masks for each custom chip or package. Instead, the same metallization layer masks are used for every chip or package to electrically connect selected conductors (or each conductor) of each wiring plane. The metallization circuit is later customized by breaking or electrically disconnecting selected connections.

Referring to FIG. 2, the substrate S represents the substrate or wafer onto which the circuits forming the integrated circuit chip have been fabricated, or the substrate onto which wiring planes may be fabricated to interconnect integrated circuit chips into a package. A first wiring plane 10 overlies the substrate S and comprises a plurality of spaced first conductors 11. In the illustrated embodiment these conductors are parallel to one another and are disposed across the entire surface of the substrate. If the substrate is an integrated circuit chip, the conductors are selectively connected to predetermined ones of the circuits therein through well known techniques. If the substrate is a semiconductor chip package, each conductor may terminate in a pad 18 for making electrical connection to the terminals of an integrated circuit chip or other electrical device, as shown.

At predetermined spaced locations the first conductors 11 have L-shaped projections or interconnecting links 14. Each link extends perpendicularly outward from the first conductor and is in electrical circuit therewith. Each is typically fabricated simultaneously with the first conductors 11 as an integral part of the first wiring plane 10, and overlies the substrate S.

It is contemplated that the first wiring plane 10 will be fabricated using a thin film deposition technique, such as sputtering, to coat the entire substrate with a conductive layer, such as aluminum, and photolithography, or other conventional techniques, are used to define the individual conductors as shown in FIG. 2. For example, this pattern of parallel lines and L-shape projections is formed by depositing a layer of photoresist on the layer of aluminum, exposing selected portions of the photoresist through a mask, and etching the same using conventional methods to expose corresponding portions of the aluminum for removal by etching.

After the first wiring plane 10 has been fabricated, a layer of insulating material 20, such as silicon dioxide, silicon nitride, silicon polyimide or other equivalent, is then formed over the first wiring plane 10 and any of the substrate S that may be exposed. Openings 22 are defined in the insulating layer at selected locations to expose selected portions of the underlying first wiring plane 10. In this preferred embodiment the openings 22 are formed to expose portions of the conductors 11 and more specifically portions of the interconnecting links 14, to accommodate electrical connections thereto. This is accomplished in accordance with the methods discussed above to fabricate the first wiring plane 10, including the steps of photoresist application, exposure, and etching.

After the openings 22 have been formed in the insulating layer, a second wiring plane 30 is formed that overlies the insulating layer 20. This second wiring plane, like the first wiring plane, also comprises a plurality of spaced, parallel conductors 31. In the illustrated embodiment each of these second conductors is disposed across the entire surface of the integrated circuit at an angle of 90° with respect to the conductors 11 of the first wiring plane 10.

The second conductors 31 may be formed using the same techniques described above for the first wiring plane. Each second conductor overlies the surface of the insulating layer 20 and the interconnection links 14 exposed by the openings 22 in the insulating layer. Thus, each conductor of each wiring plane is initially electrically connected to each conductor of the other wiring plane. FIG. 3 schematically illustrates these initial electrical interconnections between the conductors of the first wiring plane 10 and those of the second wiring plane 30.

These interconnection links may be selectively broken, as shown in FIG. 2 at gaps 40 between the interconnection link 14 and second conductor 31. This electrical disconnection or open circuit does not affect the electrical continuity of the remaining portions of the individual conductors in the wiring plane, and any exposed conductor surface may be electrically disconnected to achieve the desired circuit personalization or customization. A schematic diagram illustrating such a custom circuit is shown in FIG. 4 with electrical disconnections shown at reference numeral 40. Thus, while every conductor in the first wiring plane is initially electrically connected to every conductor in the second wiring plane, the array may be customized by opening the circuit at selected ones of the interconnection links by suitable means, such as laser deletion means L.

In other embodiments, interconnecting links may be formed and electrically connected to the second conductors, in a manner similar to those associated with the first conductor. In still other embodiments only selected ones of the conductors of the first and second wiring planes are electrically connected to each other; however, all connections are made when the second wiring plane is formed for later selected disconnection. This is used in those portions of the circuit where customization is minimal, such as a power supply.

A benefit obtained in accordance with the invention is that large quantities of custom or semi-custom semiconductor chip packages or integrated circuit chips may be prefabricated through the fabrication of one or more metallization layers, with selected conductor in one plane electrically connected to the conductors in an adjacent plane. (The invention is not limited to two wiring planes, and may be expanded to multiple levels.) Each chip or package may then be customized by simply deleting selected interconnections between the wiring planes, without the necessity of preparing a unique set of metallization masks for each custom design.

In the drawings and specification, there has been set forth a preferred embodiment of the invention, and although specific terms are employed, their use is in a generic and descriptive sense and not for purposes of limitation.

That which is claimed is:

1. For microelectronics apparatus, a method of fabricating customized connections between wiring planes, each plane having multiple conductors, the method comprising:

forming a first wiring plane having multiple conductors;

forming an insulating layer that overlies and electrically insulates the first wiring plane;

forming a second wiring plane that overlies the insulating layer by forming multiple conductors that are selectively electrically connected to the first wiring plane, selected conductors of each wiring plane being electrically connected to selected conductors of the other wiring plane; and modifying said connections by electrically disconnecting selected ones of the electrical connections between the first and second wiring planes to customize the electrical connections.

2. The method of claim 1 wherein the step of forming a second wiring plane further comprises electrically connecting each conductor of each wiring plane to each conductor of the other wiring plane.

3. The method of claim 1 wherein the step of forming an insulating layer further comprises forming openings in said insulating layer at selected locations to expose portions of the conductors of the underlying first wiring plane to accommodate electrical connections therewith.

4. The method of claim 1 wherein the step of forming a first wiring plane comprises forming a plurality of generally parallel electrically conductive strips.

5. The method of claim 1 wherein the step of forming a first wiring plane comprises forming at predetermined locations along each of the conductors interconnection links that are in electrical circuit therewith.

6. The method of claim 1 wherein the step of forming a second wiring plane comprises forming a plurality of generally parallel electrically conductive strips.

7. The method of claim 4 wherein the step of forming a second wiring plane comprises forming a plurality of electrically conductive strips that are electrically connected to the interconnection links formed with the first wiring plane.

8. The method of claim 1 wherein the step of forming a second wiring plane comprises forming multiple conductors that are angularly oriented with respect to the multiple conductors of the first wiring plane.

9. The method of claim 1 wherein the step of forming a second wiring plane comprises electrically connecting the first and second wiring plane conductors proximate selected intersections between them.

10. The method of claim 5 wherein the step of modifying said connections comprises electrically disconnecting said first and second wiring planes by opening the circuit at an interconnection link.

11. A method of fabricating customized interconnections in an integrated circuit package or integrated circuit chip between wiring planes superposed on a substrate, each plane having multiple conductors, the method comprising forming a first wiring plane upon the substrate by forming a plurality of generally parallel electrically conductive strips;

forming an insulating layer that overlies and electrically insulates the first wiring plane;

forming openings in said insulating layer at selected locations to expose selected portions of the underlying first wiring plane to accommodate electrical connections therewith;

forming a second wiring plane that overlies the insulating layer and makes electrical connection with the underlying first wiring plane by forming a plurality of generally parallel electrically conductive strips, each conductor of each wiring plane being electrically connected to each conductor of the other wiring plane; and modifying said connections by electrically disconnecting selected ones of the electrical connections between the first and second wiring planes to customize the electrical interconnections.

12. The method of claim 11 wherein the step of forming a first wiring plane comprises forming at predetermined locations along each of the conductors interconnection links that are in electrical circuit therewith.

13. The method of claim 12 wherein the step of forming a second wiring plane comprises forming a plurality of strips that are electrically connected to the first wiring plane at the interconnecting links.

14. The method of claim 13 wherein the step of modifying said connections comprises electrically disconnecting selected one of the electrical connections proximate the interconnecting links.

* * * * *